United States Patent [19]

Schuh et al.

[11] Patent Number: 5,141,584
[45] Date of Patent: Aug. 25, 1992

[54] APPARATUS AND METHOD FOR CONTROLLING THE DELAMINATION OF A LAMINATE

[75] Inventors: Dana F. Schuh, Derry, N.H.; Frank S. Silveira, Wilmington, Mass.; William P. Tobin, Salem, N.H.

[73] Assignee: Polaroid Corporation, Cambridge, Mass.

[21] Appl. No.: 800,466

[22] Filed: Nov. 27, 1991

[51] Int. Cl.⁵ .................... B32B 35/00; G03C 11/12
[52] U.S. Cl. ...................... 156/344; 156/584; 430/253; 430/256; 271/285
[58] Field of Search ............... 355/311, 315; 271/280, 271/281, 285; 430/253, 256, 257, 258, 259, 260, 261, 262; 156/344, 584; 354/354

[56] References Cited

U.S. PATENT DOCUMENTS

| | | | |
|---|---|---|---|
| 2,860,875 | 11/1958 | Staeger et al. | 271/281 X |
| 3,266,406 | 8/1966 | Stievenart | 271/285 X |
| 3,266,797 | 8/1966 | Stievenart | 271/64 |
| 3,297,317 | 1/1967 | Stievenart | 271/281 |
| 3,441,458 | 4/1969 | Milliken | 156/89 |
| 3,669,665 | 1/1972 | Faigenbaum et al. | 96/36 |
| 3,684,278 | 8/1972 | Takahaski | 271/281 |
| 3,936,343 | 2/1976 | Walls | 156/368 |
| 4,157,412 | 6/1979 | Deneau | 428/147 |
| 4,165,251 | 8/1979 | Matsumoto et al. | 156/584 |
| 4,173,510 | 11/1979 | Tobey | 156/584 |
| 4,183,751 | 1/1980 | Matsumoto et al. | 430/258 |
| 4,508,589 | 4/1985 | Tarui et al. | 156/584 |
| 4,631,110 | 12/1986 | Tsumura et al. | 156/344 X |
| 4,670,085 | 6/1987 | van der Meer et al. | 156/584 |

FOREIGN PATENT DOCUMENTS

| | | | |
|---|---|---|---|
| 45-13271 | 5/1970 | Japan | 271/285 |
| 52-53365 | 4/1977 | Japan | 271/285 |
| 62-152707 | 7/1987 | Japan | |
| 8804237 | 6/1988 | PCT Int'l Appl. | |

Primary Examiner—Michael W. Ball
Assistant Examiner—Mark A. Osele
Attorney, Agent, or Firm—Louis G. Xiarhos

[57] ABSTRACT

Apparatus and method for delaminating a composite sheet structure of the kind comprising a vertically frangible layer having a first surface adhesively bonded to a first sheet at a substantially uniform strength and an opposite surface abutting areas which are, respectively, adhesively bonded to a second sheet at strengths less or greater than the uniform strength and having a marginal portion or tab extending beyond the first sheet. The composite sheet structure is fed into the nip of upper and lower peel rollers and upon passage therethrough a strip sheet roller is rotated into position to bend and hold the laminate against the upper peel roller in a position to fracture the tab from the first sheet. On reversal of the feed direction and passage of the laminate back through the nip of the strip sheet and upper peel rollers, the thicker "keeper sheet" of the flexed laminate breaks from the "throw-away" sheet containing the tab, at the preformed tab. A roller configuration and drive train structure are provided that provides a more predictable and repeatable steady state condition and allows for control of the location of the peel point to be accomplished.

17 Claims, 4 Drawing Sheets

FIG. 6

APPARATUS AND METHOD FOR CONTROLLING THE DELAMINATION OF A LAMINATE

BACKGROUND OF THE INVENTION

The present invention relates to a novel delamination apparatus and method, and more particularly to apparatus and a method for delaminating a composite sheet structure comprising a plurality of selectively releasable superposed sheets.

There are a great many prior art references disclosing apparatus and methods for separating layers of laminating film units, for instance, for the purpose of rendering a developed image visible. Such apparatus and methods are commonly used in connection with so called peel apart film units and may utilize a blade of some kind insertable between two predetermined layers or sheets of a film unit fixed to the periphery of a rotating drum. For example see U.S. Pat. No. 4,670,085.

In general, the prior art apparatus and methods may be characterized as providing a peeling action, for instance removal of one layer from another. Such apparatus and methods however would not be suited for providing delamination as understood in the context of the present invention. Delamination in the sense used herein, is to be understood as meaning a process of separating cover or support sheets from opposite surfaces of a vertically frangible layer each carrying different portions of the frangible layer with it as determined by the strength of an adhesive bond at any given point between the surfaces of the layer and the respective sheet. Vertical frangibility of the layer as used herein is intended to mean the ability of the layer to break in a direction normal to its surface by to exclude breaking of the layer between its surfaces.

A device and method for providing the delamination as set forth above is disclosed in U.S. patent application Ser. No. 07/616,796, filed Nov. 21, 1991, and has proved successful in achieving its various objectives.

In the copending U.S. patent application of F. S. Silveira and W. P. Tobin, Ser. No. 07/800,467, filed of even date, there is disclosed a further device and method for delaminating a composite sheet structure wherein the sheet structure is fed into the nip of upper and lower peel rollers and upon passage therethrough a strip sheet roller is rotated into position to bend and hold the laminate against the upper peel roller in a position to fracture a tab located on one sheet, from the other sheet, to initiate peeling. On reversal of the feed direction and passage of the laminate back through the nip of the strip sheet and upper peel rollers, the sheets of the laminate break away from one another. The separate sheets are then fed in different directions to either waste or for further processing.

It is a primary object of the present invention to provide improved apparatus and method of the type described for the controlled delamination and feeding of the laminate sheets during the delamination or peeling process.

It is another object of the present invention to provide an improved apparatus and method of the type described for delaminating a composite sheet structure which provides a significant improvement in the control of feeding of the delaminated sheets and tab breaking compared to the prior art.

A further object of the invention is to provide an improved apparatus and method for tab breaking and feeding the laminated sheets of a composite sheet structure comprising a plurality of selectively releasable superposed sheets which increases reliability of the delamination and feeding process.

And still a further object of the invention is to provide a novel delamination apparatus and method for the controlled delamination and feeding of the support sheets which makes possible a selective removal of portions of a frangible layer by sheets adhered to opposite surfaces of the layer.

SUMMARY OF THE INVENTION

The above objects and other objectives which will become apparent as the description proceeds are accomplished by providing an apparatus having a lower peel roller and an upper peel roller disposed in spaced relation, the upper peel roller being mounted for movement toward and away from the lower peel roller. A guide means is provided for directing a composite sheet along a path between the spaced peel rollers and a stop means is disposed forwardly of the spaced peel rollers along the composite sheet path for intercepting the forward edge of the composite sheet moving along the path. A strip sheet roller and a deflector roller are disposed one adjacent the other below the composite sheet path, and each of the lower peel roller, strip sheet roller, and deflector rollers are mounted on a rotatable plate for movement about a pivot point.

Means are provided for rotating the plate upwardly to a position wherein the strip sheet roller is pressed against the upper peel roller with the composite sheet disposed therebetween, the lower peel roller pressed against the upper peel roller with the composite sheet therebetween, and the deflector roller moved below the composite sheet path.

Drive means are provided for rotating the lower peel roller in a direction to move the composite sheet rearwardly along the path and the drive means is reversible to rotate the lower peel roller in the opposite direction to move the composite structure forwardly. Drive means is provided for rotating the strip sheet roller while the lower peel roller is being driven in the said opposite direction such that the separated sheets are moved, one upwardly between the strip sheet roller and the upper peel roller, and the other downwardly contacting the lower surface of the deflector roller. The surface of rotation of the upper peel roller and lower peel roller are equal to or of greater width than the width of the composite sheet and the strip roller surface of rotation is of a lesser width than the width of the composite sheet.

The apparatus generally has an upper peel roller which provides a surface of rotation having a substantially low coefficient of friction and the lower peel roller and strip sheet roller each contain a surface of rotation of substantially high coefficient of friction, and greater than the coefficient of friction of the upper peel roller surface of rotation.

The drive means for rotating the lower peel roller is generally a positive drive motor for driving the lower peel roller at a constant rate of velocity and the drive means for rotating the strip sheet roller is a constant torque drive means.

Thus the method that is provided herein to control the delamination of a composite sheet structure is that of providing an upper and lower peel roller disposed in spaced relation and a strip sheet roller and deflector roller disposed one adjacent the other. The composite laminar structure is fed between the upper and lower peel rollers and is stopped at a predetermined point along the path. The lower peel roller, strip sheet roller and the deflector roller are moved in a generally upward direction to the position wherein the lower peel roller and the strip sheet roller are pressed against the upper peel roller with the composite laminar sheet therebetween, and the deflector roller is disposed below the path of the composite laminar sheet, the tab being disposed beyond the nip produced by the strip sheet roller being pressed against the upper peel roller. The lower peel roller is rotated in a direction to remove the composite laminar sheet rearwardly along the path causing the first and second sheets to separate.

The lower peel roller is then rotated at a constant velocity and the strip sheet roller is rotated by a constant torque drive means to feed one of the first and second sheets upwardly between the strip sheet roller and the upper peel roller, and causing the other of such sheets to contact the surface of the deflector roller and be directed downwardly from the path.

BRIEF DESCRIPTION OF THE DRAWING

Reference is made to the accompanying drawing in which there is shown an illustrative embodiment of the invention from which its novel features and advantages will be apparent, wherein.

DESCRIPTION OF THE PREFERRED EMBODIMENT

Figure 1:
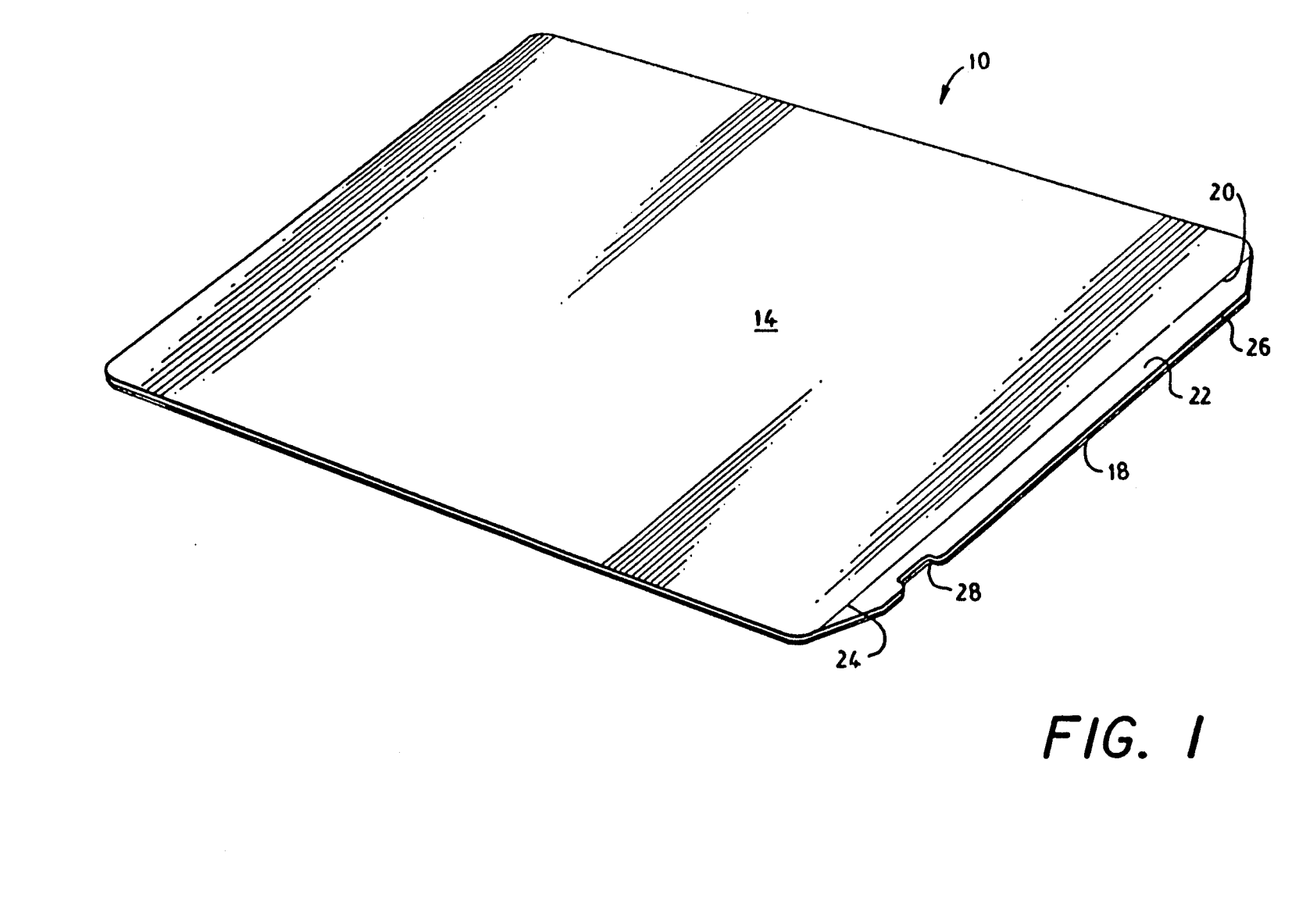
FIG. 1 is a perspective view of a preferred embodiment of a laminate which is to be delaminated by the apparatus and method of the present invention.
Figure 2:
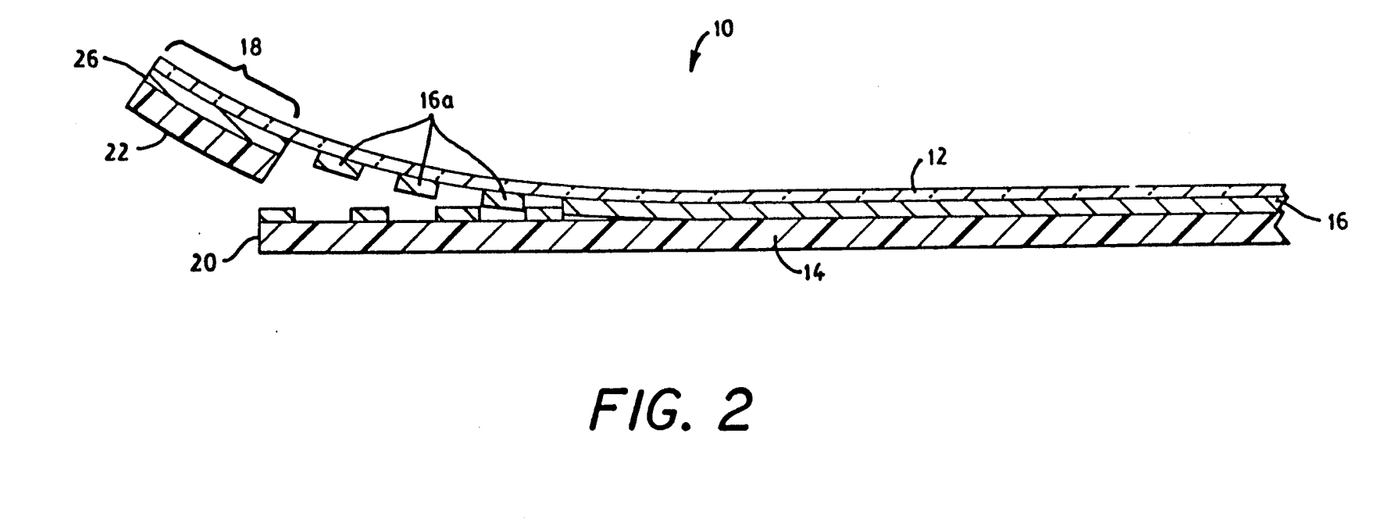
FIG. 2 is a view in longitudinal section of the laminate of FIG. 1 depicting certain aspects of its delamination characteristics with thicknesses of its several sheets being exaggerated for clarity.

Referring now to the drawing, and particularly to FIGS. 1 and 2, a laminate 10 is shown in its preferred embodiment as a thermal imaging film unit of the general kind disclosed by International Application PCT/US published June. 16, 1988 under International Publication Number WO 88/04237. The film unit comprises support sheets 12 and 14, each adhesively connected to opposite surfaces of a frangible layer 16. For purposes of the present invention, it is sufficient to note that layer 16 is such that it may be ruptured in a direction normal to its two surfaces along lines defined by exposure, such as is described in the International Application, supra. Portions of layer 16 subjected to exposure can then be separated from portions not affected by exposure to provide complementary images on the respective sheets of the composite sheet structure.

Depending upon the informational content of each of the complementary images and the desired application of such images, either of the images may be considered a principal image. It will be understood that the composite sheet structure can be subjected to a laser scanning or other exposure, such that, a predetermined image ("positive" or "negative") can be provided on either of the sheets thereof.

In the preferred embodiment depicted in FIGS. 1 and 2, the image carried by sheet 14 may be considered the principal image and, accordingly, sheet 14 is termed the "keeper" sheet, for convenience and ease of understanding. Sheet 12 is referred to as a "strip" sheet or "throwaway" sheet, recognizing that either of the keeper or throw-away images may be a principal image or an image of secondary importance, depending upon the particular uses therefor. Keeper sheet 14 is referred to hereinafter as the "first" sheet; and throw-away sheet 12 is referred to as the "second" sheet.

In a preferred laminar structure 10 of FIGS. 1 and 2, frangible layer 16 is a layer of image forming substance coated onto sheet 12 and adhered initially so as to prevent accidental dislocation. Preferably, layer 16 will comprise a pigment material such as carbon black and a binder therefor and comprises a composite of several layers conducive to forming an image of desirably high resolution and optical density as a result of thermal exposure and subsequent processing, including delamination as provided by the instant invention. Lamination of sheet 14 onto the coated sheet 12 provides a laminar composite sheet structure 10.

In the preferred laminar composite sheet structure of FIGS. 1 and 2, the adhesive bond between first sheet 14 and frangible layer 16 is, in its initial unexposed state, greater than the bond strength between second sheet 12 and frangible layer 16. As a result of exposure, the bond between exposed portions of frangible layer 16 and sheet 12 becomes stronger than the bond existing ab initio between sheet 14 and the portions of layer 16 not exposed to heat. Abutting portions of layer 16 are, thus, caused by thermal exposure to be adherent to sheet 12 at bond strengths less than and greater than the uniform bond strength between layer 16 and sheet 14. As a result of laser exposure of the depicted and preferred embodiment, portions 16a of layer 16 become more firmly bonded to sheet 12. Portions 16a i of layer 16, and portions 16b which have not been affected by heat, may then be separated from each other when the sheets 12 and 14 are delaminated in the manner of this invention.

The exposure can be carried out by a laser scanning technique or other exposing technique suited to the provision of complementarily abutting portions of frangible material separable to the respective sheets of the laminar composite sheet structure. In the preferred embodiment depicted, the exposure will take place through throw-away sheet 12 which is thinner than keeper sheet 14. The particular imaging technique employed will depend upon the particular nature of the laminar composite sheet structure, and especially, on the nature of the image forming substance and the imaging mechanism involved.

In general, it will be understood by those skilled in the art that the apparatus and method of the present invention will be useful for the separation of the sheets of any of a variety of laminar composite sheet structures wherein the preferential adhesion of an image forming substance to one of a pair of sheets is reversed, by thermal or other exposure, to provide complementarily abutting portions of frangible image forming substance separable to the respective sheets. Depending upon the image forming substance and the image forming mechanism, the reversal of such preferential adhesion can be accomplished by either strengthening or weakening the adhesive bonding between the frangible image forming substance and the respective sheets of the composite sheet structure.

The sheet 12 and 14 may be made of the same or of different material, polyethylene terephthalate, polystyrene, polyethylene, polypropylene, copolymers of styrene and acrylonitrile, polyvinyl chloride, polycarbonate and vinylidene chloride being some but not all of the material suited as support sheets. They may themselves be laminar structures provided with a backing of paper (not shown) or any other material suited for any specific purpose. It will be understood that the backing material should be transmissive of exposing radiation or be either removable to permit exposure, or positioned on a sheet opposed from that through which exposure is accomplished. While it is not a requirement, it has been found to be advantageous to have one of the sheets stiffer, i.e., less flexible than the other. The difference in stiffness may be provided by a difference in the materials of which the sheets 12 and 14 are made. Preferably, however, and as shown, the different stiffnesses are attained by one of the sheets 12 being thinner than the other sheet 14. For purposes to be described, the sheet 12 is provided with a marginal portion 18 extending beyond an adjacent margin 20 of the sheet 14. As a matter of efficient manufacture and as shown, the marginal portion or tab 18 may, but need not, be provided by a similar portion 22 of the sheet 14 severed from it by a score or cut line 24 along its margin 20.

In a common free edge 26 of the marginal portions 18 and 22 and the intermediate layer 16 there is provided a notch 28 which may conveniently serve as an alignment means for correctly placing the laminar film unit 10, or a plurality thereof, in a cassette (not shown) provided with a complementary protrusion in an orientation to ensure that the sheet 12 is facing upwardly from proper placement within the apparatus of this invention.

The length of the laminate film unit 10 measured between the score line 24 and a rear edge may typically be about 25.5 cm (10 in.), its width may be about 20 cm (8 in.), and the dimension of the marginal portion 18 between its forward edge 26 and the score line 24 may be about 6.5 mm (0.25 in.). The thicknesses of the sheets 12 and 14 measure, respectively, about 0.013 to 0.178 mm (0.5 to 7 mil) and 0.038 to 0.254 mm (1.5 to 10 mil), good results having been obtained with sheets of thicknesses of 0.045 and 0.178 mm (1.75 and 7 mil), respectively. Other dimensions may, of course, be substituted. Preferably, the corners of the sheets 12 and 14 are rounded.

Referring now to FIGS. 3 through 6, there is shown apparatus 30 for delaminating the laminate structure 10 shown in FIGS. 1 and 2, and described in detail above. The laminate 10 is fed from a prior operation by a rotatable drum (not shown) which is rotating in the counterclockwise direction to feed the laminate into the structure 30. An elongated guide bar 32 is disposed above the path of movement of the laminate 10 to insure its entry into the structure 30. As the drum rotates to move the laminate 10 it is forced upwardly against the guide bar 32 and fed along a path to a position where the forward free edge 26 of the laminate contacts an elongated stop member 34 along its path. The laminate 10 passes over a lower peel roller 36 (which rotates on shaft 37) which is mounted on a cluster plate 38, the cluster plate 38 being pivotally moveable by virtue of being mounted by a pivot pin 40 attached to a frame (a rear portion 56 of which is shown in FIGS. 3 through 6). In addition to the lower peel roller 36, a strip sheet roller 42 and a deflector roller 44 are rotatably mounted on the cluster plate 38 one adjacent the other below the path of the laminate 10.

A movable upper peel roller 46 (which rotates on shaft 47) is mounted on the frame about which the cluster plate 38 pivots and is movable downwardly toward the path of the laminate 10. As shown in the drawing Figures, a spring 48 is mounted on the frame and applies tension to bearing 50 mounted on shaft 47. Spring 48 serves to bias the upper peel roller 46 downwardly toward its lowermost position.

In each of FIGS. 3 through 6, device 30 is shown in cross section, for ease of understanding the operation of device 30. Thus, a companion cluster plate (not shown) is positioned opposite cluster plate 38. The respective cluster plates serve to support the cluster (36, 42 and 44) of rollers and are joined by a pair of tie bars (not shown) to prevent movement of the respective cluster plates relative to each other. Correspondingly, a frame (not shown) is positioned opposite frame 56 for opposed mounting of upper peel roller 46 and for attachment of a pivot pin (not shown) for pivotal movement (opposite pivot pin 40) of the companion cluster plate which, correspondingly, is moveable within a frame opening (not shown) opposed from frame opening 51. Similarly, in the manner of spring 48, a spring (not shown) is attached to the opposed frame and applies tension to a bearing (not shown) which, in the manner of bearing 50, is mounted at the opposed end of shaft 47.

Figure 3:
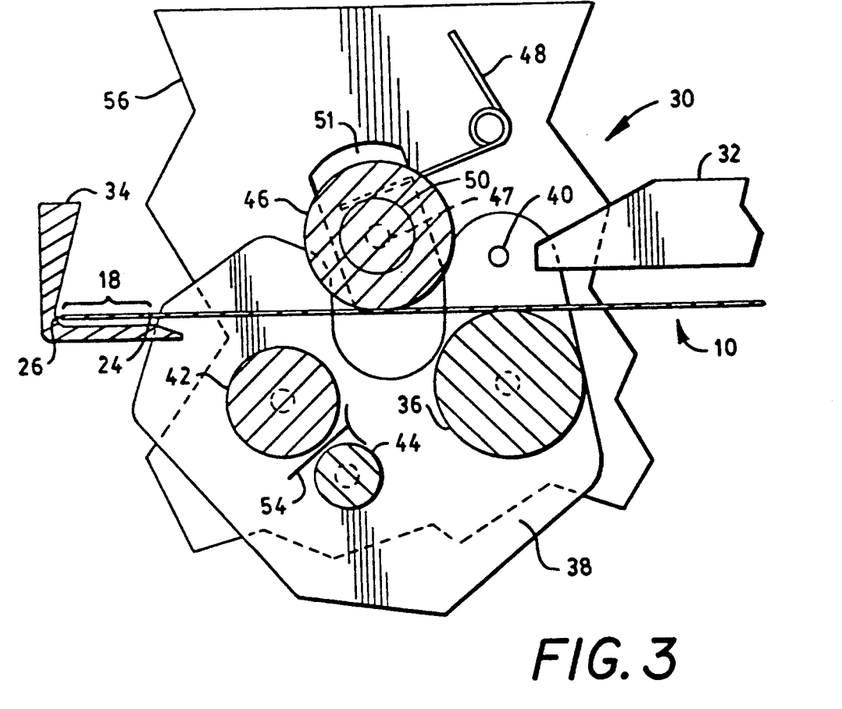
FIG. 3 is an elevational view in cross section showing details of the apparatus of the present invention in an initial operative step.

Referring to FIG. 3, the apparatus 30 is shown in the load position ready to accept a laminate sheet, and the laminate sheet 10 is passed from the drum into the apparatus, along a first path, being directed by the guide bar 32. As the drum rotates the laminate 10 reaches the elongated stop member 34 and at that point is free from the drum and located as shown in FIG. 3.

Figure 4:
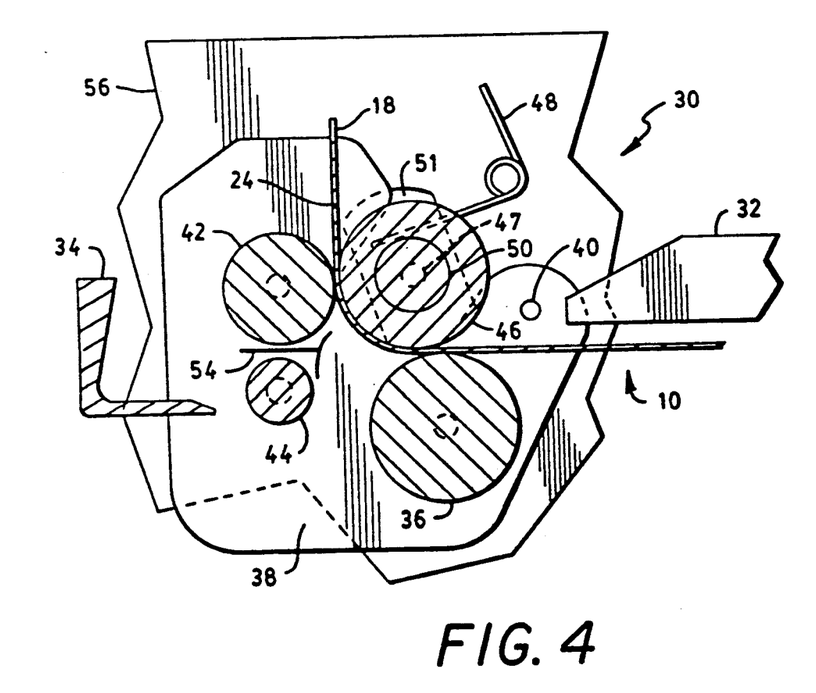
FIG. 4 is an elevational view in cross section similar to FIG. 3 showing the apparatus of FIG. 3 at a further step in the delamination process.

Referring now to FIG. 4, after the laminate is received into the apparatus 30 the apparatus is operated to the "break tab" position by rotating the cluster plate 38 containing the lower peel roller 36, the deflector roller 44 and the strip sheet roller 42. The cluster plate 38 may be rotated by any motive means such as an electric motor or other actuator.

In the position shown in FIG. 4 it should be noted that the location of the elongated stop member 34 and its relation to the upper peel roller 46 is such that the tab 18 is well past the upper nip produced by the strip sheet roller 42 being pressed against the upper peel roller 46. It has been found that feeding the laminate 10 to this depth and pivoting cluster plate 38 about properly positioned pivot pin 40, ensures that the strip sheet roller 42 will not wipe the film, or attempt to carry the laminate upwardly at the tab. Therefore, the possibility of partially separating the sheets 12 and 14 in an uncontrolled manner, or of the tab 18 folding back on itself and slipping away from the strip sheet roll 42, is minimized.

It is also of importance that the lower peel roller 36 which is driven by a motor is locked into position and is resistant to "free wheeling" or being back driven during the rotation of the cluster plate 38. As the cluster plate 38 is rotated to the break tab position shown in FIG. 4, the nip produced by the lower peel roller 36 and the upper peel roller 46 is closed first, to firmly hold the laminate 10 while the strip sheet roller 42 carries the more forward section of the laminate upward as it forms a nip, contacting the upper peel roller 46.

In the break tab position shown in FIG. 4, the laminate 10 is held around the upper peel roller 46 by both the lower peel roller 36 and strip sheet roller 42, for movement along a second path. The angle formed by a first line (not shown) joining the axes of rotation of rollers 36 and 46 and a second line (not shown) joining the axes of rotation of rollers 42 and 46 is about 90°. Upper peel roller 46 is moveable within frame opening 51. Frame opening 51 serves to constrain upward and downward movement therein of upper peel roller 46, respectively, away from and toward lower peel roller 36. The support sheet or "keeper sheet" 14 is external to the upper peel roller 46. In order to separate the tab 18 from the sheet 14 the lower peel roller 36 is driven clockwise, as shown in the drawing figures, to pull the laminate 10 back through the lower nip, along the second path, and is driven until the tab section of the laminate 10 is in the upper nip. A DC servo-motor with encoder and sensors may be used to ensure the proper drive distance and rates.

The energy stored in the short section of the thicker sheet 14 as a result of elastic bending around the upper peel roller which is in the area of ½" (12.3 mm) diameter for 90° (approximately 9.77 mm or 0.380" in length) far exceeds the energy required to overcome the peel force of the laminate and the slight increase in force to initiate peel at the score line 24 as a result of the formatting process.

It has been observed that there appears to be a somewhat higher peel force at the start of the score line 24 compared to the peel force in the bulk of the laminate, which may be due to the mechanical cutting operation which applies pressure at the cut causing a mechanical bond or enhancing the chemical bond due to the pressure.

Figure 5:
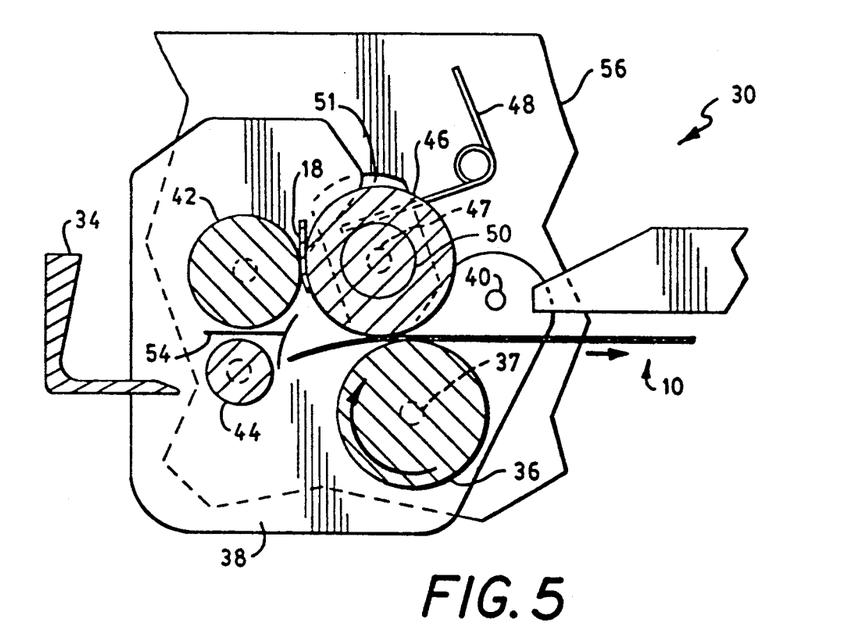
FIG. 5 is an elevational view in cross section similar to FIGS. 3 and 4 showing yet a further step in the delamination process.

The result of movement of the apparatus 30 to the break tab position as shown in FIG. 4 and the reverse operation of the lower peel roller 36 as shown in FIG. 5, which moves the laminate along the second path, is effective to cause the thicker (e.g. 7 mil; 0.178 mm) first sheet 14 to break away from the tab 18, leaving the tab 18 in the upper nip, and the sheet 14 separated from the thinner (e.g., 1.75 mil; 0.045 mm) second sheet 12 all the way back to the lower nip between the lower peel roller 36 and the upper peel roller 46.

Figure 6:
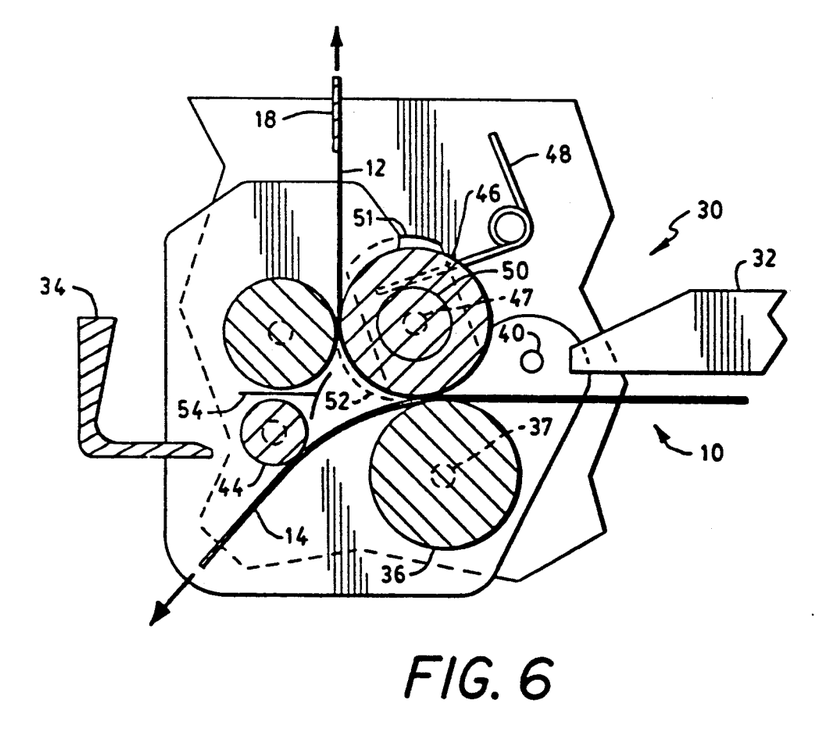
FIG. 6 is an elevational view in cross section similar to FIGS. 3 through 5 showing the laminate in its delaminated form being fed through the apparatus.

As lower peel roller 36 is now driven in a direction to move the laminate 10 forwardly into the apparatus 30, with the forward edge of the sheet 14 contacting deflector bar 54 and deflector roller 44 and moving downwardly as shown in FIG. 6, the strip sheet roller 42 is driven at a constant torque to move the support sheet 12 and tab 18 upwardly to be deposited as waste or retained, as desired.

Thus far the various elements of the apparatus 30 and their operative sequence is similar to that described in the aforementioned copending patent application to F. S. Silveira and W. P. Tobin, U.S. Ser. No. 07/800,467. However, it has been found that improved performance of the device can be obtained under conditions wherein appropriate bending of the 7 mil sheet as accomplished by the deflector roller 44 is accomplished, a controlled or steady rate of feed of laminate 10 is provided, and a controlled tension is applied to the disposable or throw away support sheet 12 at the peel nip between the upper peel roller 46 and the strip sheet roller 42.

In operation of the apparatus 30, the peel force varies according to image content, and as the peel force increases, peeling occurs farther from the peel nip. It is advantageous to allow the peel point to move in response to the change in peel force. Thus, increasing peel force creates a "bag" 52 (as depicted in FIG. 6 of the drawing) as the length of the strip sheet increases relative to the constant arc length between the two roller nips produced by lower peel roller 36 and strip sheet roller 42 forced against upper peel roller 46. A constant tension applied at the peel nip allows for the regulation of the peel point.

To accomplish the above, the upper peel roller 46 is provided with a surface of rotation having a low coefficient of friction against the surfaces of the laminate 10. The upper peel roller 46 is not driven, but is mounted in a vertical slot in the frame and is spring loaded downwardly to load the nip between its rotational surface and that of the lower peel roller 36.

The lower peel roller 36 has a rotational surface which is covered by a rubber material with a high coefficient of friction when in contact with the surfaces of the laminate 10. The lower peel roller 36 is mounted on the cluster plate 38 for rotation and is driven at a constant rate of velocity by an electric motor (not shown), as previously described, or any other constant drive means well known in the art. The lower peel roller 36 is effective to control the rate at which the unpeeled material of the laminate 10 is fed through the nip between the lower peel roller and the upper peel roller 46.

The strip sheet roller 42 is also comprised of an outer rotational surface covered by rubber material with a high coefficient of friction when contacting the sheets of the laminate 10. The strip sheet roller 42 is also fixed to the rotating cluster plate 38 but is driven at a constant torque during the delaminating process. The drive means for the strip sheet roller 42 may take the form of a motor (not shown) connected to an over driven input shaft and a mechanical slip clutch to provide the constant torque, or a current limited motor (not shown) may be provided connected directly to the strip sheet roller to provide torque control. As the support sheet 12 or throw away sheet is nipped between the strip sheet roller 42 and the upper peel roller 46 and the smooth rotational surface of the upper peel roller provides a "slippery" surface against the surface of the 1¾ mil support sheet 12, this torque control corresponds to tension control in the support sheet 12.

The loading of the strip sheet roller 42 toward the upper peel roller 6 is accomplished using a predetermined displacement of the strip sheet roller rubber material. As the cluster plate 38 is rotated into the peel position, the strip sheet roller 42 moves into the upper peel roller 46 at approximately 90° from the peel nip until a stop pin (not shown) or other stop device such as a sensor (not shown) is reached. The rubber material on the rotational surface of the strip sheet roller 42 deforms around the upper peel roller 46 to form the upper nip.

While both the upper peel roller 46 and the lower peel roller 36 have surfaces of rotation which are of the same width or larger than the width of the width of the laminate 10, the strip sheet roller 42 has its rotational surface comprising the rubber coating formed slightly narrower than the width of the laminate 10. This allows the high coefficient of friction rubber material to contact only the support sheet 12 when the upper nip is closed and feeding of the sheet takes place. In this manner, the strip sheet roller 42 is allowed to roll independently of the upper peel roller 46 when peel conditions cause the strip sheet roller surface speed to be faster or slower than the surface speed of the lower and upper peel rollers 36 and 46.

By employing the structure as set forth above, there is provided a drive method and roller configuration that provides a more predictable and repeatable steady state peel condition in the apparatus 30 and allows for control of the location of the peel point to be accomplished.

While it is apparent that changes and modifications can be made within the spirit and scope of the present invention, it is our intention, however, only to be limited by the appended claims.

As our invention we claim;

1. In apparatus for delaminating a composite sheet structure comprising a vertically frangible layer having a first surface adhesively bonded to a first sheet at a substantially uniform strength and an opposite surface abutting areas of which are, respectively, adhesively bonded to a second sheet at strengths less than and greater than the uniform strength and having a marginal portion extending beyond the first sheet, comprising:

a lower peel roller and an upper peel roller disposed in space relation, said upper peel roller being mounted for movement toward and away from said lower peel roller,     guide means for directing said composite sheet along a first composite sheet path between said spaced peel rollers,     stop means disposed forwardly of said spaced peel rollers for intercepting the forward edge of a composite sheet moving along said first composite sheet path,     a strip sheet roller and a deflector roller disposed one adjacent the other below said first composite sheet path,     each said lower peel roller and said strip sheet roller and said deflector roller being mounted on a rotatable plate for movement about a pivot point,     means for rotating said plate upwardly to a position wherein said strip sheet roller is pressed against said upper peel roller with said composite sheet disposed therebetween, to create a second composite sheet path, and wherein said lower peel roller is pressed against said upper peel roller with said composite sheet therebetween, and     drive means for rotating said lower peel roller in a direction to move said composite sheet rearwardly along said second composite sheet path,     said drive means being reversible to rotate said lower peel roller in the opposite direction to move said composite structure forwardly, and     drive means for rotating said strip sheet roller with said lower peel roller being driven in said opposite direction such that said sheets are moved separately, one upwardly between said strip sheet roller and said upper peel roller and the other contacting a lower surface of and being directed downwardly from said deflector roller,     the improvement wherein the surface of rotation of said upper and lower peel rollers are equal to or of greater width than the width of said composite sheet, and said strip roller surface of rotation is of lesser width than the width of said composite sheet.

2. The apparatus of claim 1 wherein said upper peel roller comprises a surface of rotation having a substantially low coefficient of friction.

3. The apparatus of claim 2 wherein said lower peel roller and said strip sheet roller each comprise a surface of rotation of substantially high coefficient of friction and greater than the coefficient of friction of said upper peel roller surface of rotation.

4. The apparatus of claim 1 wherein said drive means for rotating said lower peel roller is a positive drive motor for driving said lower peel roller at a constant rate of velocity.

5. The apparatus of claim 1 wherein said drive means for rotating said strip sheet roller is a constant torque drive means.

6. The apparatus of claim 1 wherein said upper peel roller surface of rotation is formed of a smooth material.

7. The apparatus of claim 1 wherein said lower peel roller and said strip sheet roller each comprise a surface of rotation formed of a rubber material.

8. The apparatus of claim 5 wherein said constant torque drive means comprises a motor coupled to an over-driven input shaft and a slip clutch.

9. The apparatus of claim 5 wherein said constant torque drive means comprises a current limited motor.

10. The apparatus of claim 4 wherein said drive means for rotating said lower peel roller is a positive drive motor for driving said lower peel roller at a constant rate of velocity.

11. The apparatus of claim 10 wherein said drive means for rotating said strip sheet roller is a constant torque drive means.

12. The apparatus of claim 11 wherein said upper peel roller surface of rotation is formed of a smooth material.

13. The apparatus of claim 12 wherein said lower peel roller and said strip sheet roller each comprise a surface of rotation formed of a rubber material.

14. The apparatus of claim 13 wherein said constant torque drive means comprises a motor coupled to an over-driven input shaft and a slip clutch.

15. The apparatus of claim 14 wherein said constant torque drive means comprises a current limited motor.

16. In a method of delaminating a composite laminar structure comprising a frangible layer having a first surface adhesively bonded to a first sheet at a substantially uniform strength and abutting areas of an opposite surface attached to a second sheet at strengths less than and greater than the uniform strength and having a marginal portion forming a tab extending beyond said first sheet comprising the steps of:

providing an upper and lower peel roller disposed in spaced relation and a strip sheet roller and deflector roller disposed one adjacent the other,     feeding said composite laminar structure along a first composite sheet path between said upper and lower peel roller,     stopping said composite laminar structure at a predetermined point along said first composite sheet path,     moving said lower peel roller, said strip sheet roller and said deflector roller in a general upward direction to a position wherein said lower peel roller and said strip sheet roller are pressed against said upper peel roller with said composite laminar sheet therebetween, to create a second composite sheet path, said tab being disposed beyond the nip produced by said strip sheet roller pressed against said upper peel roller,     rotating said lower peel roller in a direction to move said composite laminar sheet rearwardly along said second composite sheet path causing said first and second sheets to separate, and rotating said lower peel roller in the composite direction together with rotation of said strip sheet roller to feed one of said first and send sheets upwardly between said strip sheet roller and said upper peel roller and causing the other of said sheets to contact a lower surface of said deflector roller and be directed downwardly therefrom, the improvement wherein said strip sheet roller is rotated maintaining a constant torque on said strip sheet roller.

17. The method of claim 16 wherein said lower peel roller is rotated at a constant rate of velocity.

* * * * *

UNITED STATES PATENT AND TRADEMARK OFFICE
CERTIFICATE OF CORRECTION

PATENT NO. : 5,141,584            Page 1 of 3
DATED       : Aug. 25, 1992
INVENTOR(S) : Dana F. Schuh, Frank S. Silveira and William P. Tobin It is certified that error appears in the above-identified patent and that said Letters Patent is hereby corrected as shown below:

At column 3, line 54, after "PCT/US", insert --87/03249--.

The drawing sheet, consisting of Fig. 2, should be deleted to be replaced with the drawing sheet, consisting of Fig. 2, as shown on the attached page.
The drawing sheet, consisting of Figs. 3-4, should be deleted to be replaced with drawing sheet, consisting of Figs. 3-4, as shown on the attached page.

Signed and Sealed this

Fifth Day of October, 1993

Attest:

BRUCE LEHMAN

Attesting Officer          Commissioner of Patents and Trademarks